United States Patent
Park et al.

(10) Patent No.: US 7,268,376 B2
(45) Date of Patent: Sep. 11, 2007

(54) BIPOLAR TRANSISTOR FOR INCREASING SIGNAL TRANSFER EFFICIENCY AND METHOD OF MANUFACTURING THE SAME

(75) Inventors: Kang-wook Park, Seoul (KR); Bong-kil Yang, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/657,867

(22) Filed: Sep. 9, 2003

(65) Prior Publication Data
US 2004/0126979 A1   Jul. 1, 2004

(30) Foreign Application Priority Data
Sep. 19, 2002   (KR) .................. 10-2002-0057461

(51) Int. Cl.
| | |
|---|---|
| H01L 29/739 | (2006.01) |
| H01L 31/072 | (2006.01) |
| H01L 31/109 | (2006.01) |
| H01L 31/0328 | (2006.01) |
| H01L 31/0336 | (2006.01) |

(52) U.S. Cl. ................. 257/197; 257/565; 257/E29.188
(58) Field of Classification Search .............. 257/183, 257/197, 565, E29.188, 163–166, 205, 273, 257/351, 361, 378, 423, 427, 474, 477, 517, 257/526, 539, 544, 928, 19, 566–593; 438/761
See application file for complete search history.

(56) References Cited

U.S. PATENT DOCUMENTS

| | | | |
|---|---|---|---|
| 5,023,192 A | * | 6/1991 | Josquin et al. ............... 438/366 |
| 5,183,768 A | * | 2/1993 | Kameyama et al. ......... 438/370 |
| 5,459,084 A | | 10/1995 | Ryum et al. ................... 437/31 |
| 5,798,277 A | * | 8/1998 | Ryum et al. ................. 438/318 |
| 6,100,152 A | * | 8/2000 | Emons et al. ................ 438/350 |
| 2002/0058388 A1 | * | 5/2002 | Ryum et al. ................. 438/364 |
| 2004/0235256 A1 | * | 11/2004 | Arai ............................ 438/370 |

FOREIGN PATENT DOCUMENTS

| | | |
|---|---|---|
| JP | 7-183310 | 7/1995 |
| KR | 96-0019764 | 6/1996 |
| KR | 02-39319 | 5/2002 |

* cited by examiner

*Primary Examiner*—Monica Lewis
(74) *Attorney, Agent, or Firm*—Mills & Onello LLP

(57) ABSTRACT

A bipolar transistor having a base semiconductor layer structure to minimize base parasitic resistance and a method of manufacturing the bipolar transistor are provided. In the provided bipolar transistor, a collector region of a second conductivity type, which is defined by isolation regions, is formed on a semiconductor substrate of a first conductivity type. A first base semiconductor layer of the first conductivity type extends from the upper surface of the collector region to the upper surface of the isolation regions. Here, the first base semiconductor layer is formed of a silicon germanium (SiGe) layer. Second base semiconductor layers of the first conductivity type are formed on the portions of the first base semiconductor layer except for the portions having the emitter region and the emitter insulating layers. Base ohmic layers are formed on the second base semiconductor layers.

8 Claims, 5 Drawing Sheets

BIPOLAR TRANSISTOR FOR INCREASING SIGNAL TRANSFER EFFICIENCY AND METHOD OF MANUFACTURING THE SAME

BACKGROUND OF THE INVENTION

This application claims the priority of Korean Patent Application No. 2002-57461, filed on Sep. 19, 2002, in the Korean Intellectual Property Office, the contents of which are incorporated herein in their entirety by reference.

1. Field of the Invention

The present invention relates to a bipolar transistor and a method of manufacturing the same, and more particularly, to a heterojunction bipolar transistor (HBT) having excellent performances and a method of manufacturing the same.

2. Description of the Related Art

Recently, as the communication industry rapidly develops and the operating rate of data communication systems increases, devices such as high speed and high frequency transistors have been developed. Silicon level devices such as bipolar transistors, in which bases are formed by implanting impurities into silicon layers, have been commonly used; however, as demands for high-speed communication networks increase, HBT technology in which bases are formed by crystalline growing silicon germanium (SiGe) has been introduced.

In the structure of a conventional bipolar transistor, a low resistance layer such as a metal silicide layer is formed on a silicon base layer in order to reduce the resistance when flowing current from base electrodes to an emitter electrode. However, in such a structure, when the base layer is formed of a thin silicon layer including germanium to a thickness less than 1,000 Å, it is difficult to form the metal silicide layer having a predetermined thickness. In particular, when an agglomeration of the metal silicide layer occurs, the metal silicide layer may pass through the base layer and electrically contact a collector region. As a result, a schottky junction, instead of a PN junction, occurs between the base electrodes and the collector electrode, so the operation rate is lowered and the bipolar transistor may operate incorrectly. In order to prevent such results, the metal silicide layer has to be formed in a region separated from the collector region. Thus, base parasitic resistance increases, deteriorating the performance of the device, and it is difficult to reduce the size of the device.

In another conventional bipolar transistor, impurities of the same conductivity type as a base layer are ion implanted into regions adjacent to the surface of collector regions so that base implantation regions are formed. However, in such a structure, the base implantation regions having the opposite conductivity type from the impurities implanted into the collector region are formed in the collector regions, so junction capacitance increases. Thus, a large amount of a high frequency signal current, which is supplied from base electrodes, flows to a well forming the collector regions before flowing to an emitter electrode. As a result, the efficiency of the device is lowered. In addition, impurities have to be implanted through the base layer formed of a silicon layer including germanium in order to form the base implantation regions. In this case, defects occur and noise characteristics and leakage current characteristics of the device deteriorate. Therefore, the impurities cannot be heavily implanted into the collector regions to reduce the current resistance between the base electrodes and the emitter electrode, so there are limits in reducing the current resistance between the base electrodes and the emitter electrode. On the other hand, the current resistance between the base electrodes and the emitter electrode can be reduced by reducing the parasitic resistance by reducing the length of a non-intrinsic base region, which is a region that extends from a base ohmic electrode to an intrinsic base region. However, when the length of the non-intrinsic base region in the conventional bipolar transistor including the base implantation regions is reduced, a leakage current is generated at the junction of the collector regions and the emitter region. Accordingly, there are limits in reducing the length of the non-intrinsic base region, so there are limits in reducing the size of the device.

SUMMARY OF THE INVENTION

The present invention provides a bipolar transistor, which increases signal transfer efficiency and has a structure so as to reduce power consumption and noise and can perform rapid signal processing by minimizing parasitic junction capacitance between a collector and a base, minimizing a base parasitic resistance, and reducing a current resistance between base electrodes and an emitter electrode.

The present invention also provides a method of manufacturing a bipolar transistor, which increases signal transfer efficiency and has a structure so as to reduce power consumption and noise and can perform rapid signal processing by minimizing parasitic junction capacitance between a collector and a base, minimizing a base parasitic resistance, and reducing a current resistance between base electrodes and an emitter electrode.

According to an aspect of the present invention, there is provided a bipolar transistor comprising a semiconductor substrate of a first conductivity type, and a collector region of a second conductivity type, which is defined by isolation regions on the semiconductor substrate. A first base semiconductor layer of the first conductivity type formed of a silicon germanium (SiGe) layer extends from the upper surface of the collector region to the upper surface of the isolation regions. An emitter region of the second conductivity type is formed on the first base semiconductor layer to contact the first base semiconductor layer In a region which is defined by emitter insulating layers formed on the first base semiconductor layer. In addition, second base semiconductor layers of the first conductivity type formed of a silicon layer are formed on the portions of the first base semiconductor layer except for the portions having the emitter region and the emitter insulating layers. Base ohmic layers are formed on the second base semiconductor layers. An emitter electrode is formed on the emitter region. Base electrodes are formed on the second base semiconductor layers at both sides of the emitter electrode.

It is preferable that the second base semiconductor layers be formed of an epitaxial growing layer. It is preferable that the first conductivity type be p-type and the second conductivity type be n-type.

The bipolar transistor according to the present invention may further comprise first selectively ion implanted collector (SIC) regions of the second conductivity type, which are formed at portions near the surface of the collector region and adjacent to the isolation regions.

The bipolar transistor according to the present invention may further comprise a second SIC region of the second conductivity type, which is formed in a portion of the collector region under the emitter region.

It is preferable that the base ohmic layers be formed of metal suicide. For example, the base ohmic layers are formed of one of titanium silicide and cobalt silicide.

The bipolar transistor according to the present invention may further comprise insulating layers formed between the isolation regions and the first base semiconductor layer, under the base electrodes. Here, the insulating layers are formed of one of oxide layers and nitride layers.

In addition, the bipolar transistor according to the present invention may further comprise silicon layers formed between the insulating layers and the first base semiconductor layer.

According to another aspect of the present invention, there is provided a method of manufacturing a bipolar transistor comprising forming a semiconductor substrate of a first conductivity type and a collector region of a second conductivity type, which is defined by isolation regions, on the semiconductor substrate. A first base semiconductor layer of the first conductivity type is formed on the isolation regions and the collector region. Emitter insulating layers are formed on the first base semiconductor layer, and an emitter region of the second conductivity type, of which a contact region to the first base semiconductor layer is defined by the emitter insulating layers is formed on the first base semiconductor layer. Second base semiconductor layers of the first conductivity type formed of silicon layers are formed on the portions of the first base semiconductor except for the emitter region and the emitter insulating layers. Base ohmic layers are formed on the second base semiconductor layers. Base electrodes are formed on the base ohmic layers.

It is preferable that a mono-crystalline silicon layer contacting the collector region be formed using a selective epitaxial growing method. A SiGe layer including impurities of the first conductivity type is formed on the mono-crystalline silicon layer in order to form the first base semiconductor layer.

It is preferable that the second base semiconductor layers be formed at a temperature of 500 to 900° C.

The method according to the present invention may further comprise forming an emitter of the second conductivity type in a portion of the first base semiconductor layer contacting the emitter region, by performing a thermal treatment on the resultant structure having the emitter region.

In addition, the method according to the present invention may further comprise forming first SIC regions of the second conductivity type in portions of the collector region near the surface of the collector region and adjacent to the isolation regions. Furthermore, the method according to the present invention may further comprise forming a second SIC region of the second conductivity type in a portion of the collector region under the emitter region.

The method according to the present invention may further comprise forming insulating layer patterns, which expose the collector region, on the isolation regions before the first base semiconductor layer is formed. Here, forming silicon layer patterns, which expose the collector region, on the insulating layer patterns may be included.

In the bipolar transistor according to the present invention, parasitic resistance and junction capacitance are minimized while reducing the current resistance between the base electrodes and the emitter electrode, so the transfer efficiency is increased and signal distortion due to temperature is reduced. Accordingly, the device can be operated at a high speed and noise level can be lowered by using small signals and low electric power.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
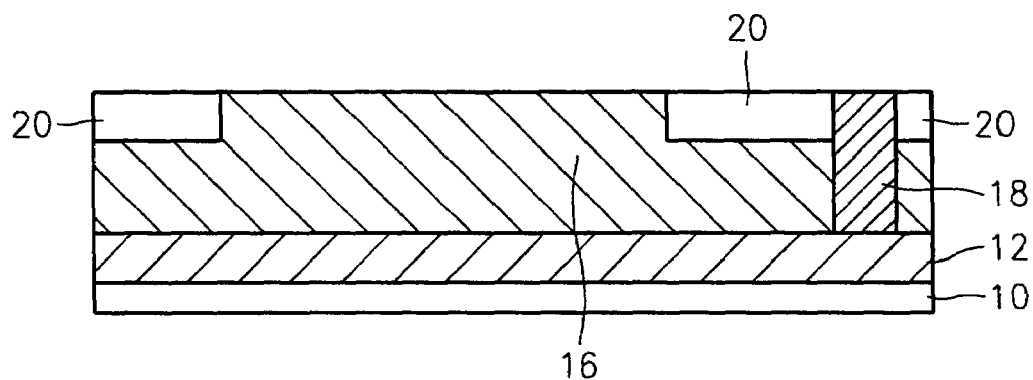
FIGS. 1 through 11 are sectional views illustrating a method of manufacturing a bipolar transistor according to an embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. In the drawings, the size and the thickness of layers and regions are exaggerated for clarity. It will also be understood that when a layer is referred to as being "on" another layer or substrate, it can be directly on the other layer or substrate, or intervening layers may also be present.

FIGS. 1 through 11 are sectional views illustrating a method of manufacturing a bipolar transistor according to an embodiment of the present invention.

Referring to FIG. 1, n-type impurities such as phosphorus (P) are implanted into a p-type semiconductor substrate 10 to form an $n^+$-type high dose collector region 12 and an $n^-$-type low dose collector region. Thereafter, in order to electrically isolate adjacent devices, isolation regions 20 are formed by, for example, a shallow trench isolation (STI) method. Here, the isolation regions 20 may be formed by a local oxidation of silicon (LOCOS) method, a polysilicon spacer LOCOS (PSL) method, or a polysilicon buffered LOCOS (PBL) method, rather than the STI method. Next, n-type impurities are implanted into an exposed portion of the semiconductor substrate 10 using a photoresist layer (not shown) as a mask, thus forming an $n^+$-type collector sinker 18. Here, the isolation regions 20 are formed in the low dose collector region except for the portions used to form a collector region 16 as an active region and the collector sinker 18. The collector region 16 is defined by the isolation regions 20.

Figure 2:
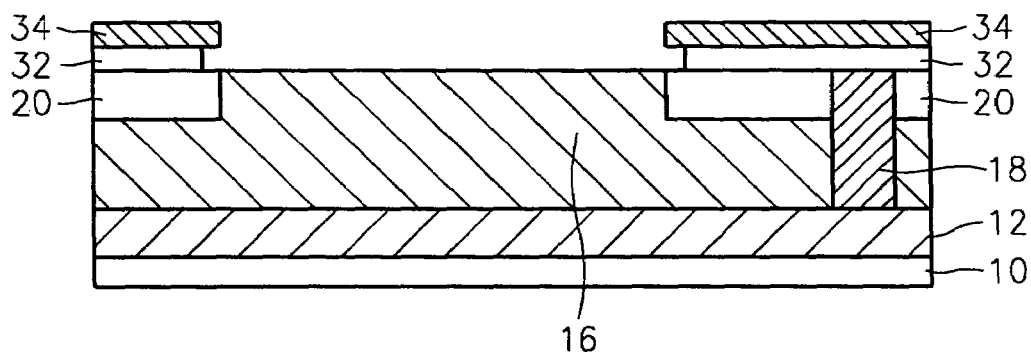

Referring to FIG. 2, sequentially stacked first and second first insulating layer patterns 32 and first and second silicon layer patterns 34 are formed on the semiconductor 10, on which the upper surfaces of the collector region 16 and the collector sinker 18 are exposed, while exposing the collector region 16. To this end, a first insulating layer, for example, an oxide layer or a nitride layer, are formed on the semiconductor substrate 10, and a silicon layer is formed thereon. Here, the silicon layer can be formed of a silicon germanium (SiGe) layer. Thereafter, the silicon layer is dry etched by photolithography to form the first and second silicon layer patterns 34, and the first insulating layer is wet etched using the first and second silicon layer patterns 34 as an etch mask to form the first and second first insulating layer patterns 32.

Here, the first insulating layer patterns 32 can be formed by dry etching instead of wet etching.

Figure 3:
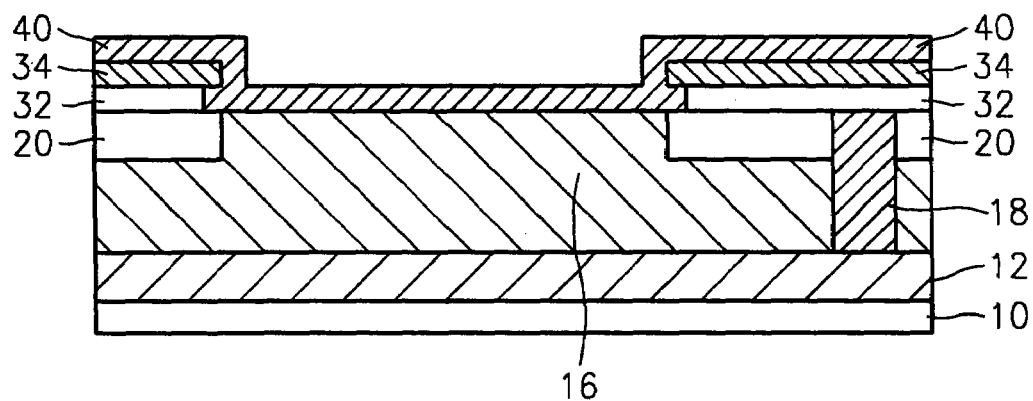

Referring to FIG. 3, a p$^+$-type first base semiconductor layer 40 formed of a SiGe layer is formed on the resultant structure, in which the collector region 16 is exposed by the first and second silicon layer patterns 34, to a thickness of hundreds to 2,000 Å. Here, the first base semiconductor layer 40 is formed by a selective epitaxial growing method at a relatively low temperature, which is selected from a temperature range from 500 to 900° C. Therefore, the portion of the first base semiconductor layer 40 contacting the collector region 16 is formed of a mono-crystalline silicon layer, and a SiGe layer in which p-type impurities such as boron (B) are doped at a proper dosage and gradient, is formed on the mono-crystalline silicon layer.

Figure 4:
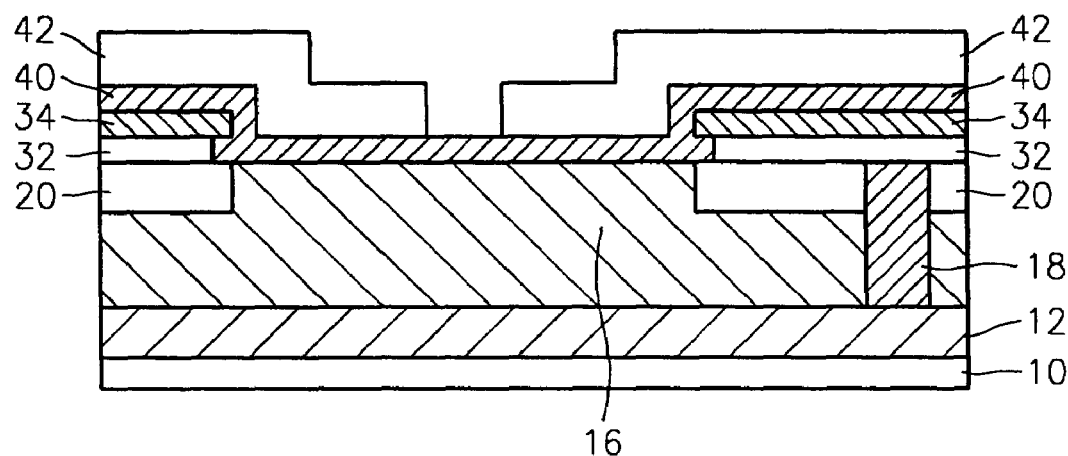

Referring to FIG. 4, a second insulating layer, which is required to electrically isolate an emitter region to be formed in a subsequent process, is formed on the first base semiconductor layer 40. The second insulating layer is formed of, for example, an oxide layer or a nitride layer. Thereafter, the second insulating layer is patterned by photolithography, forming second insulating layer patterns 42 that expose an emitter junction portion of the collector regions 16.

Figure 5:
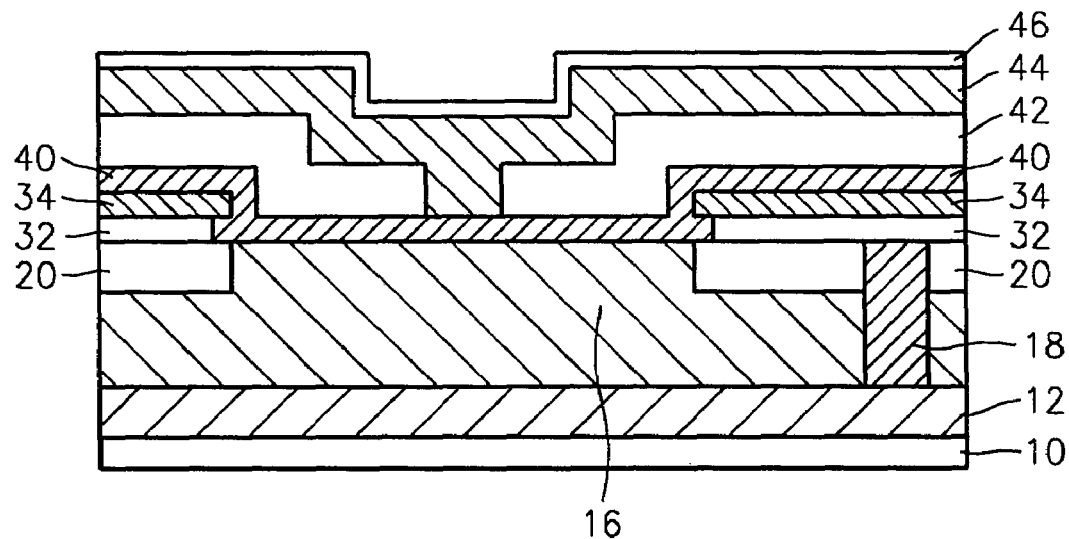

Referring to FIG. 5, an n$^+$-type silicon layer 44 is formed on the resultant structure having the second insulating layer patterns 42. Here, the silicon layer 44 is formed to form an emitter region. The n$^+$-typed silicon layer 44 can be formed by doping n-type impurities in a deposition process of the silicon layer 44 or by ion implanting n-type impurities after the silicon deposition process. In order to prevent a needless silicon layer due to a selective silicon growing process on the silicon layer 44, a third insulating layer 46 is formed on the silicon layer 44. Here, the third insulating layer 46 can be formed of an oxide layer or a nitride layer.

Figure 6:
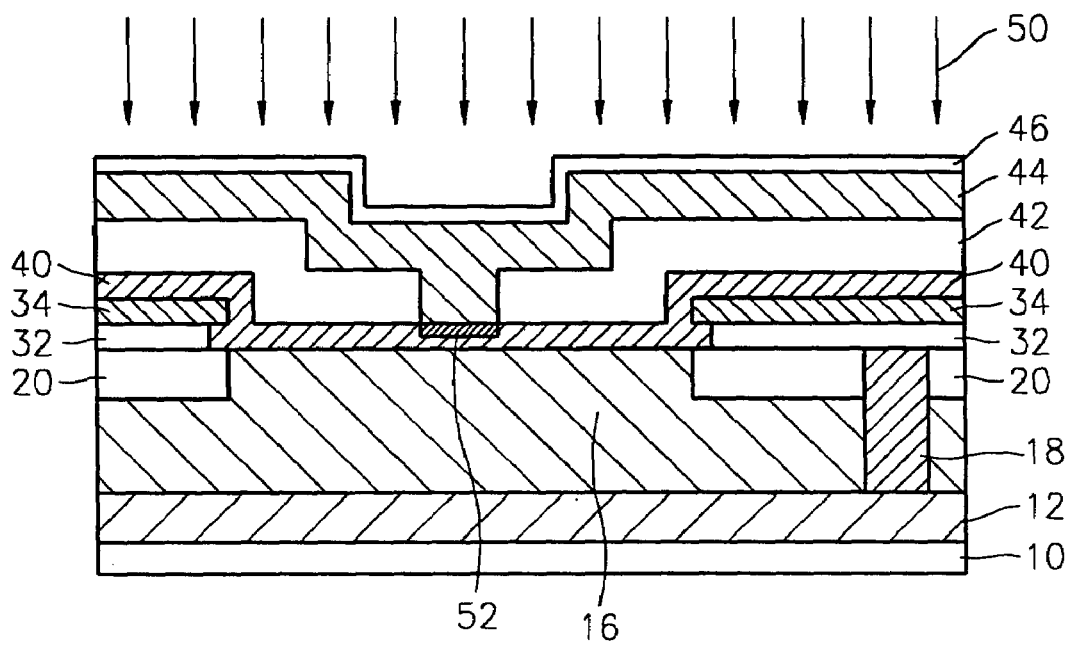

Referring to FIG. 6, a thermal treatment 50 is performed on the resultant structure to form an emitter junction. Here, the thermal treatment 50 can be, for example, a rapid thermal anneal (RTA) process, which is performed at a temperature of 800 to 1,000° C. As a result, an n$^+$-type emitter 52 is formed in the portion of the first base semiconductor layer 40, which contacts the silicon layer 44. The thermal process 50 can be omitted in some cases.

Figure 7:
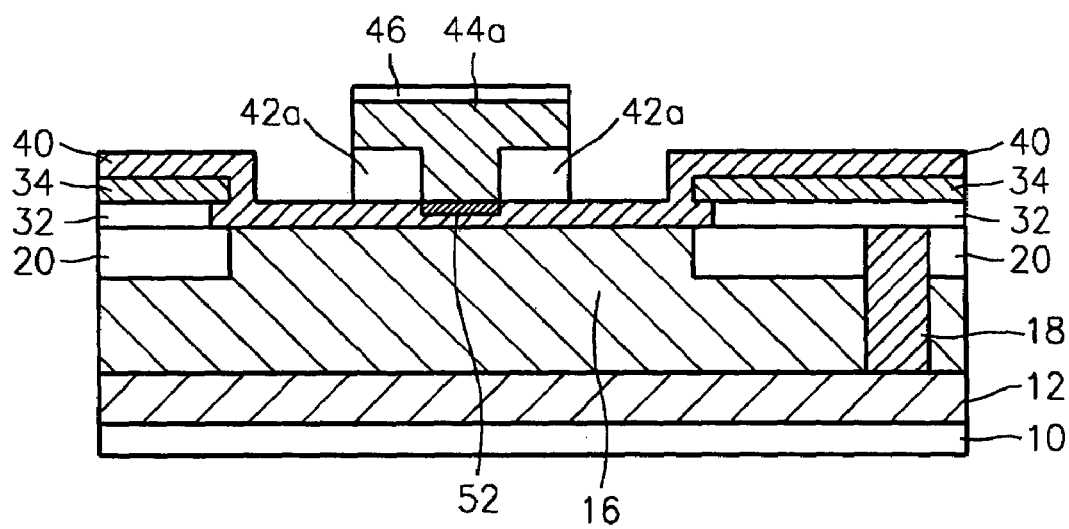

Referring to FIG. 7, the third insulating layer 46, the silicon layer 44, and the second insulating patterns 42 are patterned by photolithography, so an n$^+$-type emitter region 44a and emitter insulating layers 42a, which define the emitter region 44a, are formed.

Figure 8:
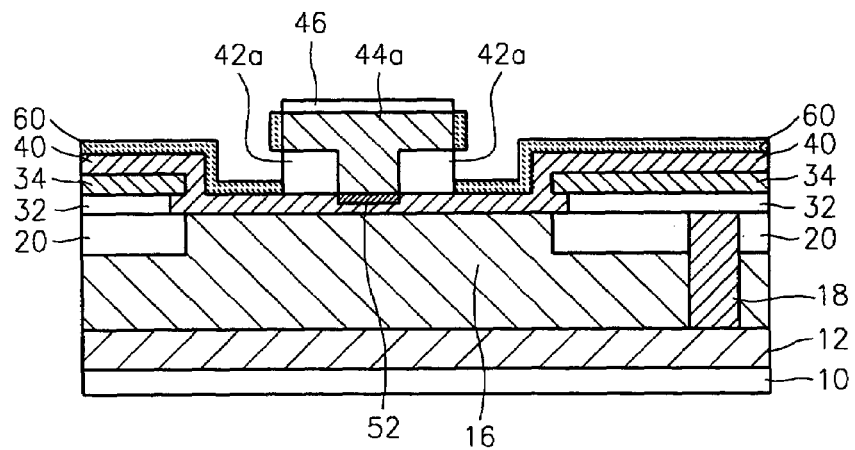

Referring to FIG. 8, silicon is grown on the exposed surface of the first base semiconductor layer 40 by a selective epitaxial growing method, which is performed at a relatively low temperature selected from a range from 500 to 900° C., so that second base semiconductor layers 60, in a pattern of selectively epitaxially grown silicon, are formed to a thickness of about 1,000 Å. Here, the second base semiconductor layers 60 are formed to include p-type impurities. In this case, the silicon is epitaxially grown on the exposed surfaces of the emitter region 44a.

Figure 9:
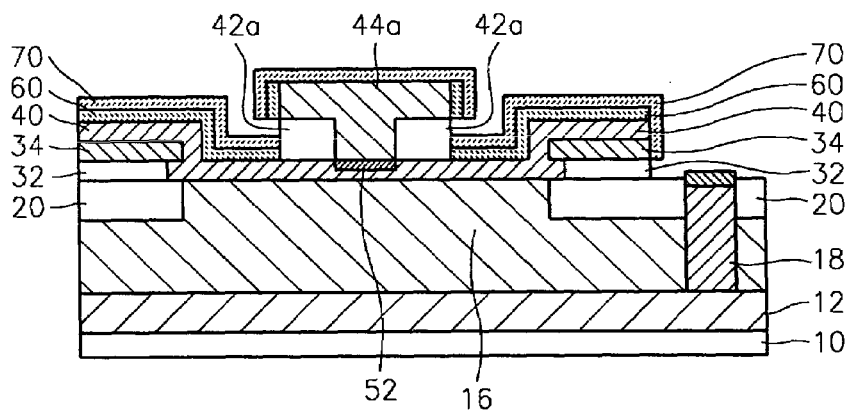

Referring to FIG. 9, unneeded portions of the first insulating layer patterns 32, the silicon layer patterns 34, the first base semiconductor layer 40, the third insulating layer 46, and the second base semiconductor layers 60 are removed by photolithography, and base ohmic layers 70 formed of metal silicide are formed on the second base semiconductor layers 60, the base ohmic layers 70 being a pattern of metal silicide. To this end, the exposed silicon of the second base semiconductor layers 60 is covered with metal, such as titanium or cobalt, and the metal is converted into metal silicide. Here, metal silicide layers are formed on the exposed silicon portions of the semiconductor substrate 10, i.e., the exposed surfaces of the emitter region 44a and the upper surface of the collector sinker 18.

Figure 10:
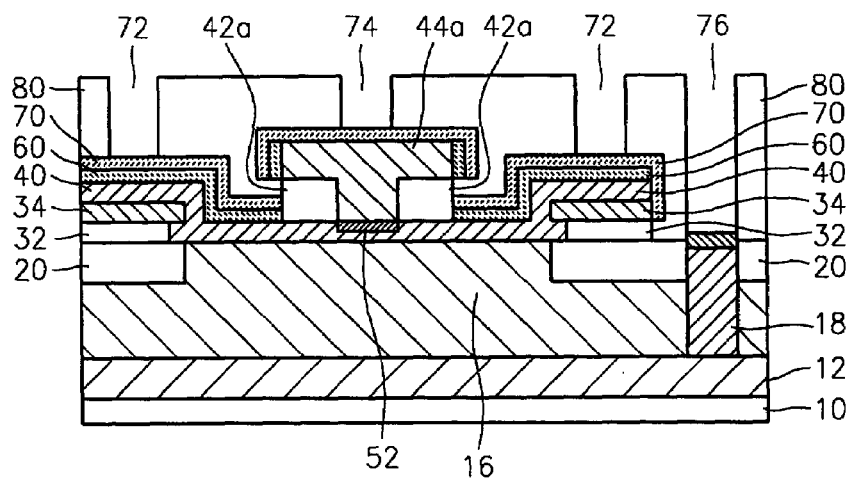

Referring to FIG. 10, a planarized fourth insulating layer is formed on the resultant structure having the base ohmic layers 70, and the fourth insulating layer is patterned to form fourth insulating layer patterns 80 in which base electrode regions 72, an emitter electrode region 74, and a collector electrode region 76 are opened.

Figure 11:
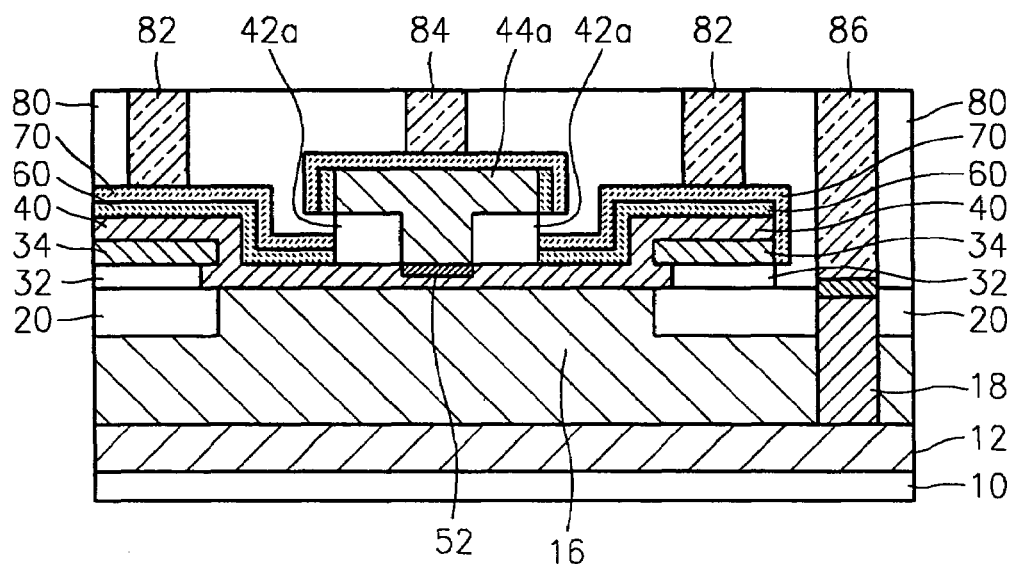

Referring to FIG. 11, a metal interconnection material, for example, copper or aluminum, is deposited on the resultant structure having the fourth insulating layer patterns 80, and the metal interconnection material is etched back to form base electrodes 82, an emitter electrode 84, and a collector electrode 86. Here, the base electrodes 82 are formed at both sides of the emitter electrode 84.

As described above, in the bipolar transistor according to the present invention, the second base semiconductor layers 60 formed of the same material as that of the first base semiconductor layer 40 are formed on the first base semiconductor layer 40. Here, the first base semiconductor layer 40 is formed of the SiGe layer, which extends from the upper surface of the collector region 16 to the upper surfaces of the isolation regions 20. In addition, the base ohmic layers 70 are formed on the second base semiconductor layers 60. The second base semiconductor layers 60 are formed of layers having a resistance smaller than the resistance of the metal silicide of forming the base ohmic layers 70. Here, the impurities of the same conductivity type as those of the first base semiconductor layer 40 are implanted into the second base semiconductor layer 60. Thus, impurities can be heavily implanted into the second base semiconductor layers 60 while not forming base implantation regions by implanting the same impurities as those implanted into the base layer, at portions near the surface of the collector region. Accordingly, the current resistance between the base electrodes 82 and the emitter electrode 84 can be reduced, and defects due to the ion implantation do not occur. In addition, since the base Implantation regions are not formed in the collector region 16, a junction capacitance between semiconductor regions of opposite conductivity types can be reduced in the collector region 16.

In addition, the horizontal length of the emitter insulating layers 42a can be reduced, so the current resistance between the base electrodes 82 and the emitter electrode 84 can be easily reduced.

Furthermore, since the second base semiconductor layers 60 are formed on the first base semiconductor layer 40, the base ohmic layers 70 formed of metal silicide can be stably formed on the second base semiconductor layers 60. Thus, the current resistance between the base electrodes 82 and the emitter electrode 84 can be efficiently reduced. As a result, the operating rate of the device is improved, and the noise level of the device is lowered.

Figure 12:
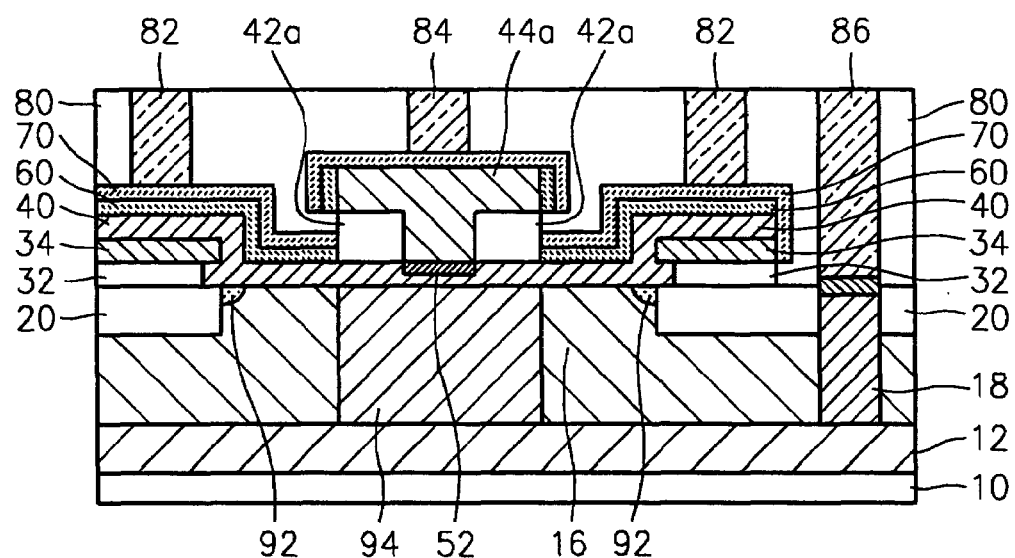
FIG. 12 is a sectional view illustrating a method of manufacturing a bipolar transistor according to another embodiment of the present invention.

FIG. 12 is a sectional view illustrating a method of manufacturing a bipolar transistor according to another embodiment of the present invention. In FIG. 12, the elements corresponding to the elements of FIGS. 1 through 11 are denoted by the same reference numerals as those in FIGS. 1 through 11.

As shown in FIG. 12, n-type impurities are ion implanted into portions of a collector region 16, which are near the upper surface of the collector region 16 and adjacent to isolation regions 20, to form n-type first selectively ion implanted collector (SIC) regions 92. N-type impurities are ion implanted into a portion of the collector region 16 under the emitter region 44a to form an n-type second SIC region 94.

The first SIC regions 92 are formed to prevent the generation of leakage current at the edge portions of the isolation regions 20, i.e., the interfaces between oxide layer and silicon. Here, the first SIC regions 92 are formed by, for example, ion implanting the n-type impurities before the second base semiconductor layers 60 are formed. The first SIC regions 92 are formed at a low dose of about $1 \times 10^{11}$ to $1 \times 10^{13}$ cm$^{-2}$.

The second SIC region 94 is formed to prevent a Kirk effect, which lowers a cutoff frequency $f_T$ at high current regions of the bipolar transistor. Here, the second SIC region 94 can be formed by ion implanting the n-type impurities after second insulating layer patterns 42 are formed or before a first base semiconductor layer 40 is formed, as described with reference to FIG. 4. By forming the second SIC regions 94, the serial resistance of a collector can be reduced and the operating rate of the collector can be improved.

In the bipolar transistor according to the present invention, the second base semiconductor layers, which are formed of the same material as the first base semiconductor material while having the same conductivity type as that of the first base semiconductor layer, are formed on the first base semiconductor layer formed of the SiGe layer. The base ohmic layers are formed on the second base semiconductor layers. Here, the second base semiconductor layers have a lower resistance than that of the base ohmic layers, and the current resistance between the base electrodes and the emitter electrode can be reduced by heavily implanting impurities into the second base semiconductor layers. In addition, since the base implantation regions are not required in the collector region, the junction capacitance, between the semiconductor regions having opposite conductivity types can be reduced in the collector region.

The impurities having the same conductivity type are added to the first and second base semiconductor layers so that defects due to the ion implantation do not occur. In addition, since the horizontal length of the emitter insulating layers can be reduced, the current resistance between the base electrodes and the emitter electrode is reduced and the size of the device is reduced. Furthermore, by forming the second base semiconductor layers on the first semiconductor layer, the base ohmic layers can be stably formed on the second base semiconductor layers so that the current resistance between the base electrodes and the emitter electrode can be efficiently reduced.

As described above, in the bipolar transistor according to the present invention, the parasitic resistance and the junction capacitance are minimized while reducing the current resistance between the base electrodes and the emitter electrode, so the transfer efficiency is increased and signal distortion due to temperature is reduced. Accordingly, the device can be operated at a high speed and noise level lowered by using small signals and low electric power.

While this invention has been particularly shown and described with reference to preferred embodiments thereof, it will be understood by those skilled in the art that various changes in form and details may be made therein without departing from the spirit and scope of the Invention as defined by the appended claims

What is claimed is:

1. A bipolar transistor comprising:
a semiconductor substrate of a first conductivity type;
a collector region of a second conductivity type, which is defined by first and second isolation regions on the semiconductor substrate;
a first base semiconductor layer of the first conductivity type formed of a silicon germanium (SiGe) layer, which extends across the upper surface of the collector region to the upper surface of the first and second isolation regions;
emitter insulating layers formed on the first base semiconductor layer, wherein the emitter insulating layers define an emitter junction portion on the first base semiconductor layer;
an emitter region of the second conductivity type formed on the emitter junction portion on the first base semiconductor layer to contact the first base semiconductor layer through the emitter junction portion, wherein the emitter region has sidewalls being in contact with sidewalls of the emitter insulation layers;
second base semiconductor layer patterns of the first conductivity type formed of a silicon layer, which is formed directly on portions of the first base semiconductor layer except for portions of the first base semiconductor layer having the emitter region and the emitter insulating layers, wherein the second base semiconductor layer patterns are spaced apart from the emitter region by the emitter insulating layers positioned between the emitter region and the second base semiconductor layer patterns;
base ohmic layer patterns formed on the second base semiconductor layer patterns;
an emitter electrode formed on the emitter region;
base electrodes formed on the second base semiconductor layer patterns at both sides of the emitter electrode;
first and second insulating layer patterns formed between the first and second isolation regions, respectively, and the first base semiconductor layer, under the base electrodes; and
first and second silicon layer patterns formed between the first and second insulating layer patterns, respectively, and the first base semiconductor layer.

2. The bipolar transistor of claim 1, wherein the second base semiconductor layer patterns are formed of an epitaxial growing layer.

3. The bipolar transistor of claim 1, wherein the first conductivity type is p-type and the second conductivity type is n-type.

4. The bipolar transistor of claim 1, further comprising first selectively ion implanted collector (SIC) regions of the second conductivity type, which are formed at portions near the surface of the collector region and adjacent to the first and second isolation regions.

5. The bipolar transistor of claim 4, further comprising a second SIC region of the second conductivity type, which is formed in a portion of the collector region under the emitter region.

6. The bipolar transistor of claim 1, wherein the base ohmic layer patterns are formed of metal silicide.

7. The bipolar transistor of claim 6, wherein the base ohmic layer patterns are formed of one of titanium silicide and cobalt silicide.

8. The bipolar transistor of claim 1, wherein the first and second insulating layer patterns are formed of one of oxide layers and nitride layers.

* * * * *